United States Patent [19]

Juengling

[11] Patent Number: 5,718,800
[45] Date of Patent: Feb. 17, 1998

[54] SELF-ALIGNED N+/P+ DOPED POLYSILICON PLUGGED CONTACTS TO N+/P+ DOPED POLYSILICON GATES AND TO N+/P+ DOPED SOURCE/DRAIN REGIONS

[75] Inventor: Werner Juengling, Boise, Id.

[73] Assignee: Micron Technology, Inc., Boise, Id.

[21] Appl. No.: 555,496

[22] Filed: Nov. 8, 1995

[51] Int. Cl.$^6$ ............................................. H01L 21/00
[52] U.S. Cl. ....................... 156/643.1; 156/636.1; 156/644.1; 156/657.1; 437/41; 437/225; 437/228
[58] Field of Search ................. 156/636.1, 643.1, 156/644.1, 656.1, 657.1, 659.11, 648.1; 437/41 R, 41 MOS, 43, 192, 200, 225, 228 POL, 228 PL; 216/38

[56] References Cited

U.S. PATENT DOCUMENTS

| | | | |
|---|---|---|---|
| 5,015,594 | 5/1991 | Chu et al. | 437/228 PL |
| 5,022,958 | 6/1991 | Favreau et al. | 437/228 PL |
| 5,112,765 | 5/1992 | Cederbaum et al. | 437/228 PL |

Primary Examiner—William Powell
Attorney, Agent, or Firm—Workman, Nydegger & Seeley

[57] ABSTRACT

A method for preparing an SRAM or DRAM structure on a substrate with an oppositely doped well therein, a field oxide region extending above and between the well and the substrate, first and second NMOS transistors on the silicon substrate, an NMOS word line transistor over the field oxide region, and a PMOS transistor on the silicon well. The source and drain regions of each of the PMOS transistor and the first and second NMOS transistors each have a doped polysilicon plug making contact therewith. The NMOS word line has a polysilicon plug contacting the gate electrode thereof. Each polysilicon plug is isolated one from another, has the same doping as the region with which it makes contact, and is self-aligned to surrounding structures due to etchant selectivities and photoresist masks. The SRAM or DRAM structure is formed in an inventive process having two masking steps, where each masking step opens areas for self-aligned plugs having a common doping and opens a region above the NMOS word line.

37 Claims, 9 Drawing Sheets

SELF-ALIGNED N+/P+ DOPED POLYSILICON PLUGGED CONTACTS TO N+/P+ DOPED POLYSILICON GATES AND TO N+/P+ DOPED SOURCE/DRAIN REGIONS

BACKGROUND OF THE INVENTION

1. The Field of the Invention

The present invention relates to the manufacture of semiconductor circuit devices. More particularly, the present invention is directed to a novel process for reducing the number of masking steps needed to form self-aligned plugged contacts to source/drain regions and plugged contacts to polysilicon lines over field oxide regions.

2. The Relevant Technology

FIG. 1 depicts a P− doped silicon well 10 with an N− doped silicon well 12 therein. Well 12 has an N+ doped active area 11a therein seen at g. Also within N− doped silicon well 12 are two P+ doped active areas 11 seen at h and i. Similarly, there are four N+ doped active areas 13 seen at a, b, c, d, and P+ doped active area 13a seen at e within P− doped silicon well 10. A plurality of field oxide regions 14 insulate doped active areas 11, 11a, 13, 13a, one from another. A layer of BPSG 16 is deposited over all structures above P− and N− doped silicon wells 10, 12. Regions e and g are intended to be tub ties, isolated by field oxide regions from source/drain regions d and h.

Four MOS transistors are seen in FIG. 1 and are indicated, respectively, by A, B, C, and E. Additionally, FIG. 1 shows a polysilicon word line D. Between transistors A and B there will be formed a contact to N+ source/drain active area b. Between transistor B and transistor C, there will be formed a contact to N+ source/drain active area c. Between transistor C and polysilicon word line D, there will be formed a contact to P+ doped active area e. Between polysilicon word line, D and transistor E, there will be formed two contacts, respectively, to N+ doped active area g and to P+ doped active area h. To the right of transistor E, there will be formed another contact to P+ doped active area i.

With respect to the forgoing active areas and structures, shallow N+ source/drain active areas a through d are formed for NMOS devices A, B, and C which devices are situated over P− doped silicon well 10. Active area e represents a shallow P+ well contact to P− doped silicon well 10. Active area g represents a shallow N+ well contact to N− doped silicon well 12. Active areas h and i shown in FIG. 1 each represent a shallow P+ source/drain contact to PMOS device E.

Several N+ doped polysilicon gate electrodes 18, 20 are located above P− doped silicon well 10 and also above N− doped silicon well 12. For each gate electrode 18, 20, a thin gate oxide region 15 of approximately 80–100 Angstroms resides thereunder. Above each gate electrode 18, 20, there is situated a tungsten silicide layer 22. Superimposed on each gate electrode 18, 20 and each tungsten silicide layer 22, there is both a nitride layer 24 and a nitride spacer 25. The channel for each gate electrode 18 is isolated by thin gate oxide 15.

The formation of the structure seen in FIG. 1 can be accomplished by a variety of fabrication steps. One example of such steps is described below.

N− doped silicon well 12 is formed in P− doped silicon well 10. Subsequently, field oxide regions 14 are formed in wells 10, 12. Thin gate oxide layer 15 is grown over what will become the active areas of wells 10, 12. A layer N+ doped polysilicon 18 is deposited, and then tungsten silicide layer 22 is deposited there over, which is followed by a deposition of a layer of nitride 24. Each of the gates of the MOS devices are then conventionally printed and etched so as to form gate stacks seen at A, B, C, D, and E in FIG. 1.

After the forgoing construction of gate stacks, a P+ doped ion implant is made into portions of wells 10, 12 so as to form active areas 11, 13a. Similarly, an N+ doped ion implant is made into portions of wells 10, 12 so as to form active areas 11a, 13 therein.

After the foregoing ion implants, a layer of nitride is deposited on the surface over all of the substrate and is etched back anisotropically so as to form nitride spacers 25 upon gate stacks A through E seen in FIG. 1. Additional N+ and P+ implants follow to finish the transistor. Finally, a passivation layer of borophosphosilicate glass (BPSG) 16 is deposited over all of the substrate. BPSG 16 layer is then flowed and subsequently densified to provide a good oxide isolator of the substrate.

FIG. 1 represents a conventional CMOS structure that can be accomplished by the foregoing manipulative steps, or by other fabrication processing steps known in the art.

Following the construction seen in FIG. 1, typically contacts will be formed to contact holes in the N+ source/drain active areas a, b, c, d, and g, as well as to contact holes in the P+ source/drain active areas e, h, i, and to a contact hole in the polysilicon word line D. These contacts are made using doped polysilicon plugs. In order to make these contacts in the conventional process flow, three contact masks are printed and etched. The contacts are then filled with an N+ or P+ doped polysilicon layer deposition which will become polysilicon plugs.

The first of the three masks opens up surface contacts to active areas a, b, c, d, and g seen in FIG. 1. Active areas a, b, c, d, and g have contact holes opened up using a dry etch chemistry to etch oxide with selectivity to nitride and silicon. A second mask is then used to open up a contact in the region f over word line D of FIG. 1. The region seen at f is opened using a second dry-etch chemistry having a recipe that subsequently etches oxide and nitride with selectivity to WSi$_x$ and to poly silicon. Following the second mask, N+ doped polysilicon is deposited so as to fill contact holes to active areas a, b, c, d, and g created by the first dry etch, and the contact hole seen in the region f to word-line D is created by the dry etch. A deposited layer of N+ doped polysilicon will form N+ doped polysilicon plugs in the resultant structure.

A third mask is used to open up self-aligned contact holes to P+ active areas e, h, and i. A third dry etch chemistry is used to etch polysilicon with selectivity to oxide, and then to etch oxide with selectivity to both nitride and silicon. Following the third mask, a deposition of P+ doped polysilicon is made so as to fill the contacts to P+ doped active areas e, h, and i. The deposited layer of P+ doped polysilicon will form the P+ polysilicon plugs in the resultant structure. Subsequent to the deposition of the P+ doped polysilicon layer, a chemical-mechanical polishing step (CMP), or alternatively etch back step, is made so as to isolate P+ doped silicon plugs and the N+ doped silicon plugs from each other.

The result of the foregoing three masks and associated fabrication steps is seen in the structure depicted in FIG. 9. FIG. 9 shows the isolation of N+ doped polysilicon plugs 56 from P+ doped polysilicon plugs 38. A convention in the structure seen in FIG. 9 is that doping of like kind to an active are is used for a contact plug to the active area. Thus, P+ plugs make contact to P+ active areas and N+ plugs make contact to N+ active areas. Three masks were necessary in the foregoing prior art fabrication process flow due to the incompatibility of subsequent etchings, as well as doping considerations.

It would be an advance in the art to provide a process flow that would result in a CMOS structure having appropriate contacts where the process flow used less than three masking steps so as to increase throughput, reduce processing time, and reduce cost.

SUMMARY AND OBJECTS OF INVENTION

An object of the present inventive process flow is to create self-aligned N+/P+ doped polysilicon plugged contacts to N+/P+ doped source/drain regions, and to create N+ doped polysilicon plugged contacts to N+ doped polysilicon gates in less than three masking steps. It is another object of the inventive process flow to create N+/P+ doped polysilicon contacts to N+/P+ doped polysilicon gates that have been exposed twice by masking/etchings, while also causing the self-alignment of the contacts by polysilicon plugs of like doping to N+/P+ doped source/drain regions in the same number of masking steps.

In accordance with the inventive process flow, a first and a second masking step are applied to a silicon substrate having an array of transistors and polysilicon word lines thereon. Preferably, a CMOS structure will be situated on the silicon substrate. Both the polysilicon word lines and the array of transistors are covered by an oxide passivation layer.

The result of the first masking step seen in FIGS. 2 and 3, which defines what will become contacts to active layers e, h, and i. Also, the first masking step begins to form what will be a contact to word line D at region f. To define these contacts, the passivation layer is patterned by photoresist and a dry etch chemistry is applied following patterning to the structures seen in FIG. 1 that etches the oxide passivation layer with selectivity to both nitride and silicon.

Following the oxide etch of the passivation layer, P+ doped polysilicon is deposited to fill contacts formed for active areas e, d, h, and i. The contact formed above region f seen in FIGS. 2-3 stops on the nitride spacer over the polysilicon gate of word line D and does not make contact with the underlying $WSi_x$ or the polysilicon gate of word line d.

The result of the second masking step is seen in FIGS. 5 and 6, which defines what will become the contacts to active areas a, b, c, f, and g. Additionally, a contact in region f for word line D is defined in the second masking step. To form these contacts, the P+ polysilicon layer is patterned by photoresist and a dry chemistry etch is applied. This second etching step has several components. The first component etches polysilicon with selectivity to oxide, and the second component etches nitride with selectivity to oxide. This etch step opens a contact to word line D in region f. The third and final etch component etches oxide with selectivity to nitride, $WSi_x$, and to polysilicon. This third etch component opens contacts to active areas a, b, c, and g.

Following the three-component etch of the second masking step, a layer of N+ doped polysilicon is deposited so as to make contacts at active areas a, b, c, f, and g. Lastly, the deposited layers of N+ doped and P+ doped polysilicon undergo a chemical-mechanical polishing step, or alternatively an etch back step, so as to isolate the resultant oppositely doped contact plugs one from another. Thus, there are established in two masking steps self-aligned, plugged doped contacts of like doping to polysilicon gates and to source/drain regions.

These and other objects and features of the present invention will become more fully apparent from the following description and independent claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
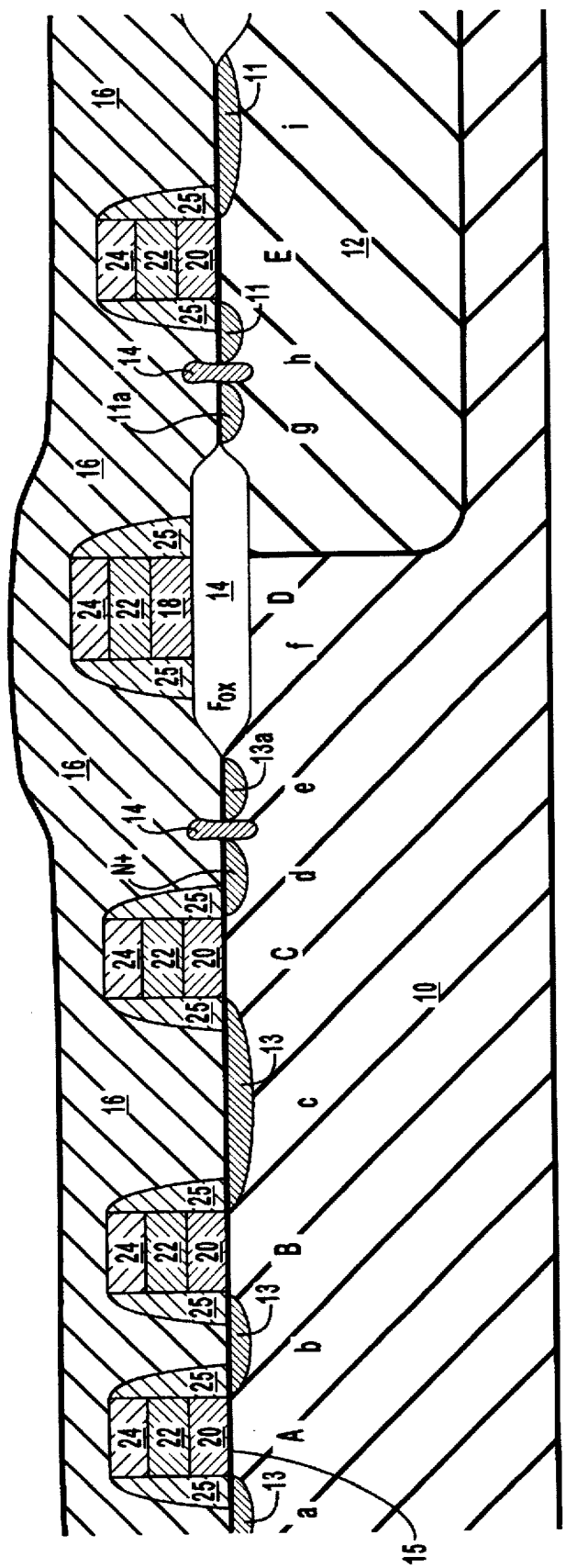
FIG. 1 is a cross-sectional elevation view illustrating a complementary field-effect transistor (CMOS) which shows N+ and P+ channel MOS devices on the same semiconductor substrate, which substrate particularly has NMOS transistors A, B, and C over a P– doped silicon well, one PMOS transistor E over an N– doped silicon well with adjacent shallow P+ doped source/drain active areas h and i, a P– well contact e, N– well contact h, and a word line D over a field oxide region situated between the oppositely doped wells, with all structures being covered by a passivation layer.
Figure 2:
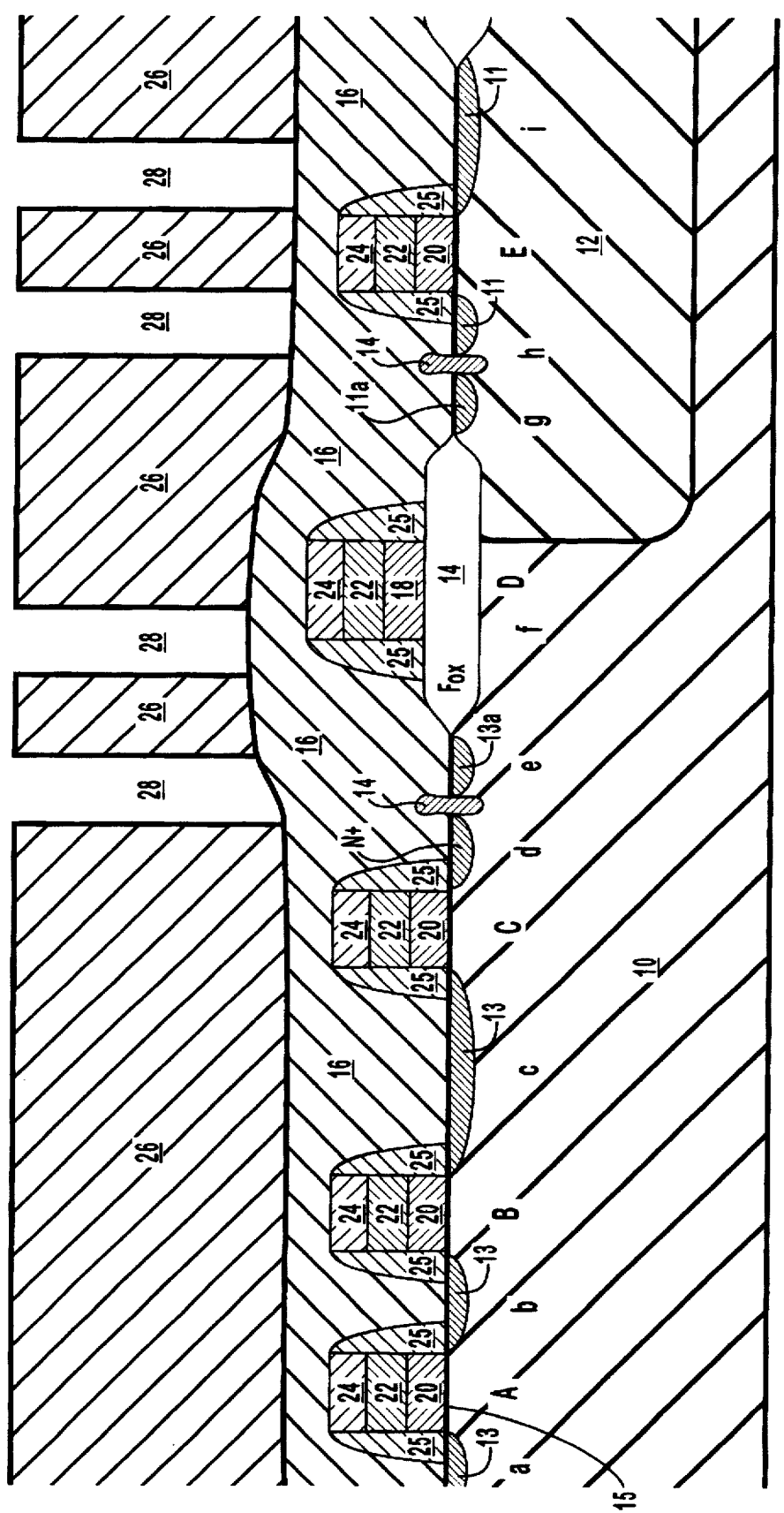
FIG. 2 is a cross-sectional elevation view of the structure seen in FIG. 1, with the addition of a layer of patterned photoresist.
Figure 9:
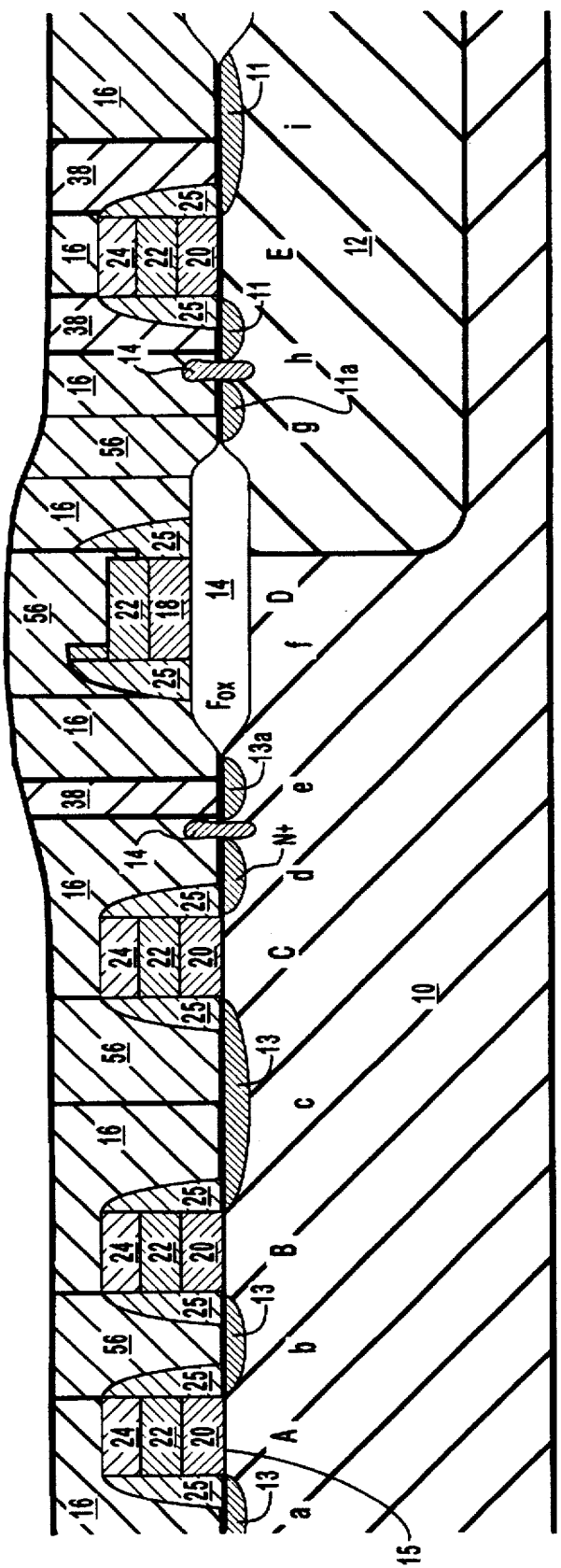
FIG. 9 is a cross-sectional elevation view of the structure seen in FIG. 8, and shows the result of a height reduction processing step, such as a chemical-mechanical polishing step, or alternatively a dry chemistry etch back step, so as to isolate oppositely doped polysilicon contact plugs one from another.

The novel process uses two masks and material selected etches, rather than three masks as in the prior art processes, so as to contact a CMOS structure using conductive plugs, such as polysilicon plugs. The structure seen in FIG. 9 is made using the novel process which, in a preferred embodiment, opens up two independent masks. In the first mask, P+ doped contact areas are opened and a gate contact is partially opened up. In the second mask, N+ contact areas are opened up, and the opening of the gate contact is completed. In these two masking steps, one of the normally three masking steps will be avoided due to the ability to combine different etches which etch different materials within the same step at different times. This novel process is described as follows:

As seen in FIG. 2, a photoresist layer 26 is spun on over BPSG layer 16 as seen in FIG. 1. First photoresist layer 26 is exposed and developed to result in first photoresist contact patterns 28 which lie immediately above areas seen in FIG. 2 at e, f, h, and i.

Figure 3:
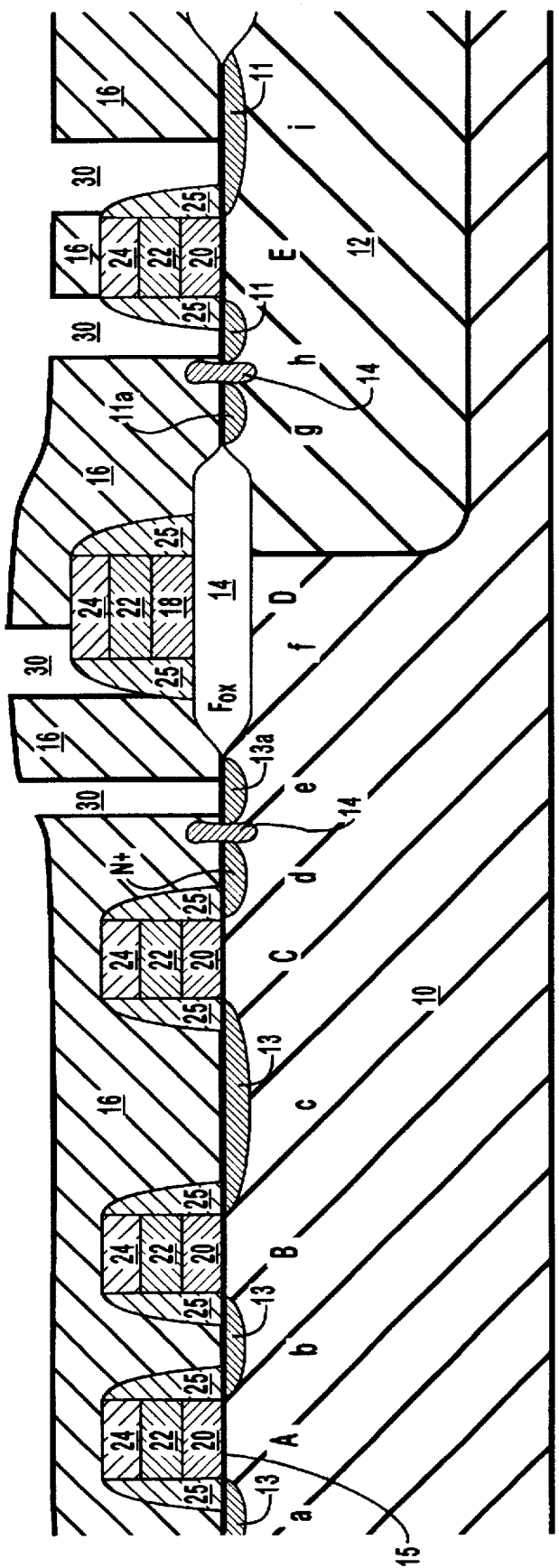
FIG. 3 is a cross-sectional elevation view of the structure seen in FIG. 2 showing the result of additional fabrication processing steps of etching through the structure so as to form contact holes to the doped substrate in the areas seen at e, f, h, and i, and removing the photoresist layer thereafter.

FIG. 3 shows the result of an etching step producing a first etch pattern 30 that opens active area e, nitride layer 24 over word line D, and active areas h and i. First photoresist layer 26 seen in FIG. 2 has been cleaned from the structure seen in FIG. 3. Preferably, this etching step is a dry etch using a chemistry that etches oxide with selectivity to nitride and silicon. As can be seen from FIG. 3, contacts opened to active regions, e, h, and i have become self-aligned with respect to adjacent transistor gates/word lines at the bottom and side of first etch pattern 30 due to etch selectivities and photoresist contact patterns 28 seen in FIG. 2.

Figure 4:
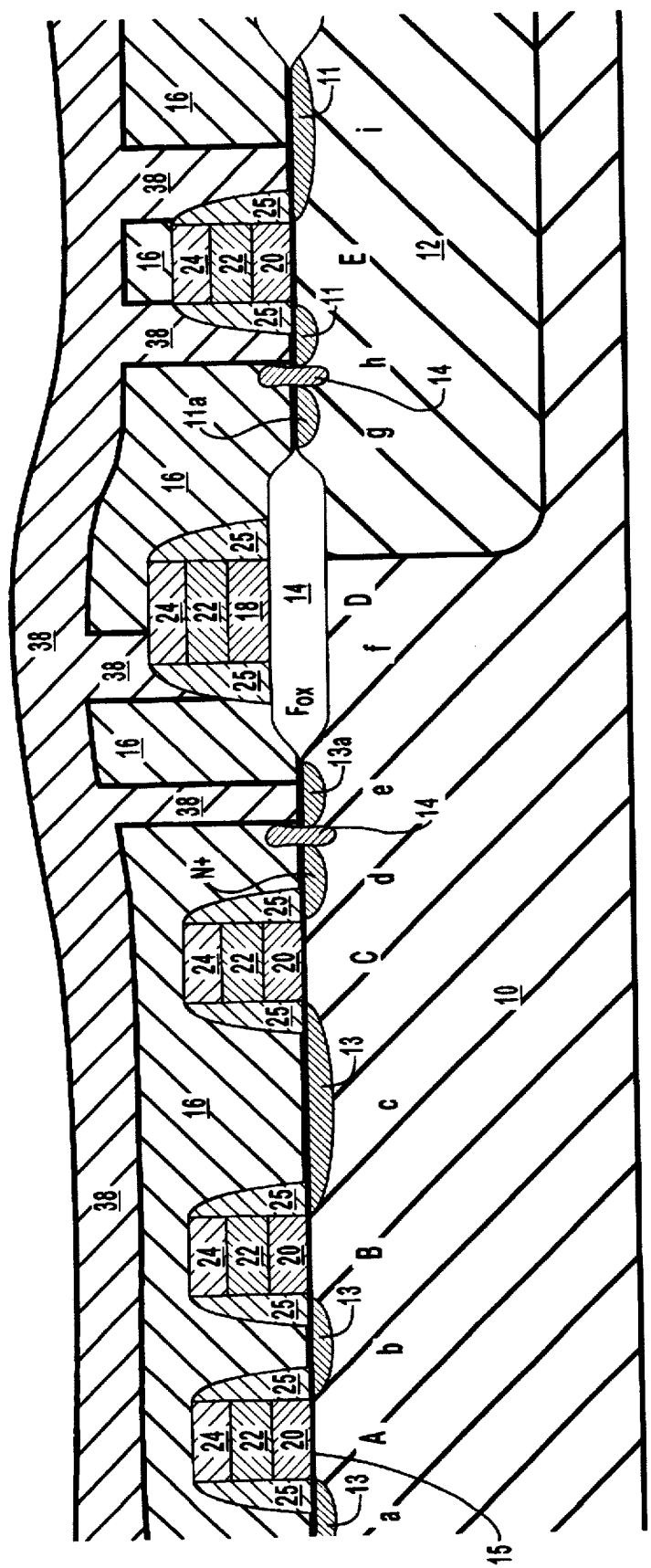
FIG. 4 is a cross-sectional elevation view of the structure seen in FIG. 3, with the addition of a layer of P+ doped polysilicon which covers the structure and the contact holes seen in FIG. 4 at e, f, h, and i.

As illustrated in FIG. 4, a P+ doped polysilicon layer 38 is deposited over the then exposed structure so that P+ doped polysilicon layer 38 makes contact with active areas e, h, and i, as well as with nitride layer 24 of word line D.

Figure 5:
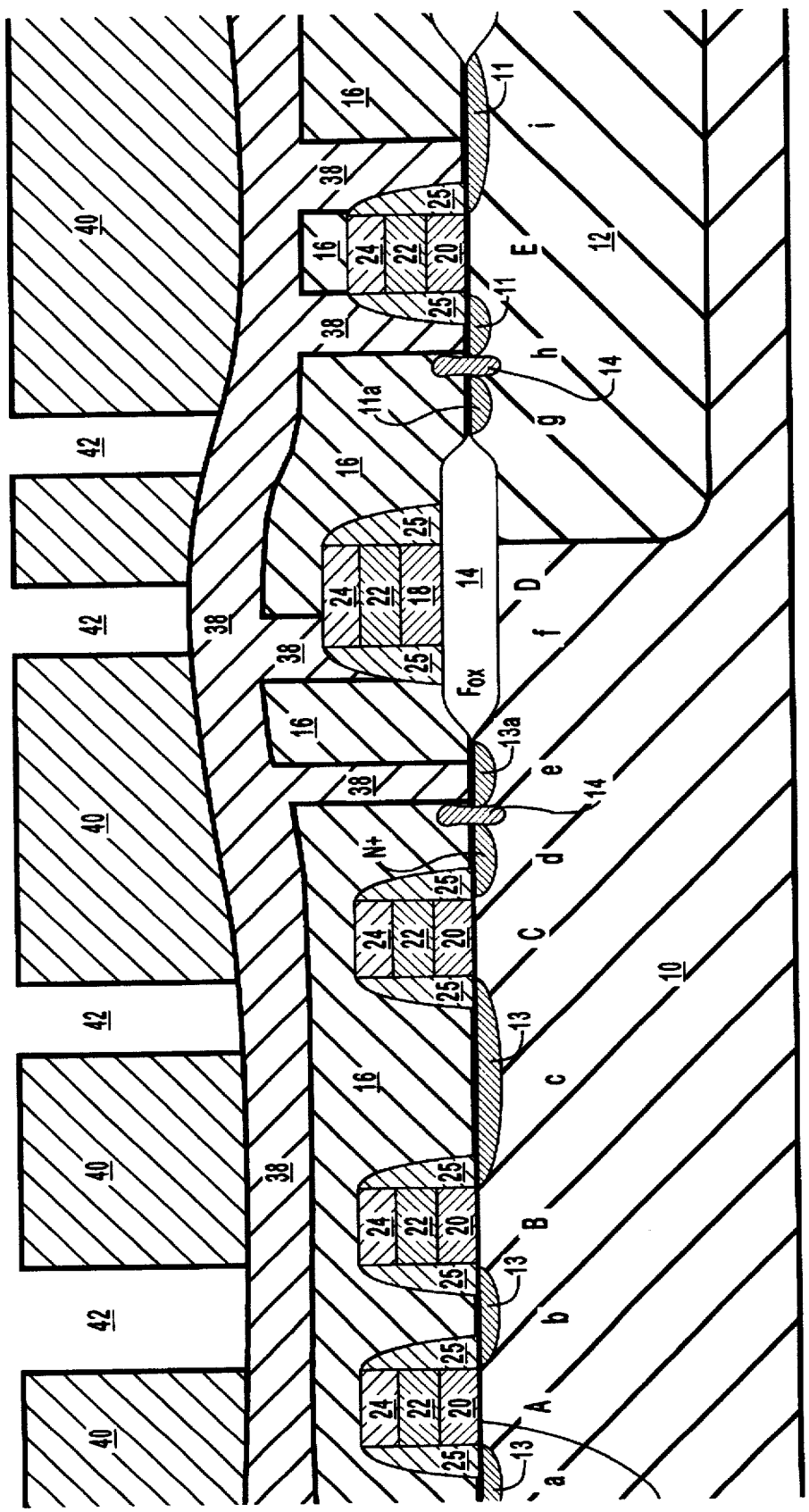
FIG. 5 is a cross-sectional elevation view of the structure seen in FIG. 4, with the addition of a layer of patterned photoresist to the existing structure.

FIG. 5 shows that P+ doped polysilicon layer 38 has deposited thereover a second photoresist layer 40, which is aligned, exposed and developed to create a second photoresist contact pattern 42 in second photoresist layer 40. Second photoresist contact pattern 42 is made so as to open up contact areas seen in FIG. 5 at regions b, c, f, and g of the structure. Like first photoresist contact pattern 28, second photoresist contact pattern 42 is also situated over the region seen at f above the gate of word line D.

Figure 6:
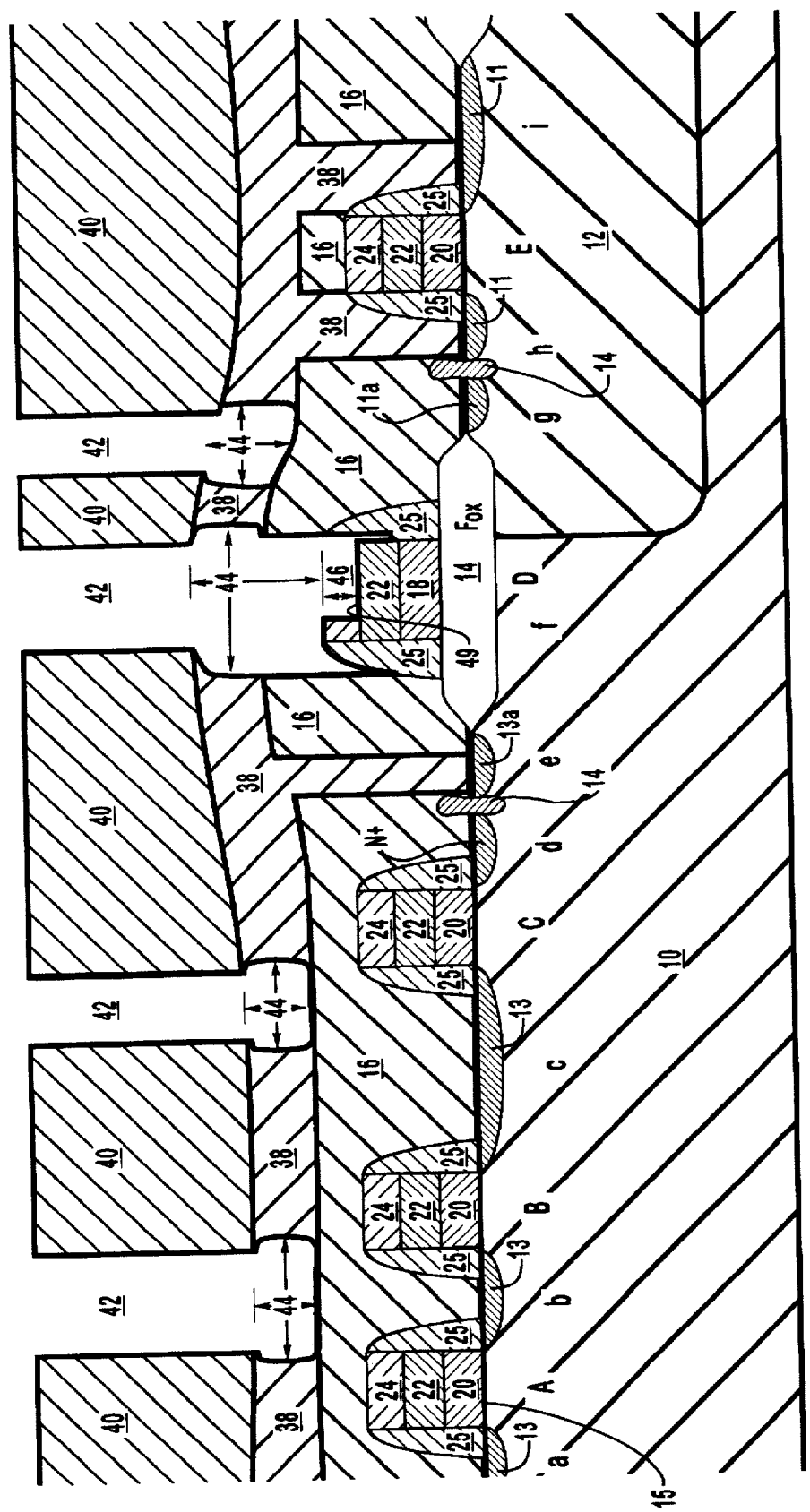
FIG. 6 is a cross-sectional elevation view of the structure seen in FIG. 5, where second and third etching steps have been performed on the structure so as to create a contact hole over the word line in the region seen at f of FIG. 6.

FIG. 6 shows the result of a second and a third etching step, etching polysilicon and nitride, respectively. These two etching steps result in the opening in the region seen at f in FIG. 6, which is above the gate of word line D. The aforedescribed double exposure to open up a contact to the gate of word line D can cause problems by misalignment between these two exposures. Preferably, the second etching step should have a nonanisotropic polysilicon etch so as to remove polysilicon stringers. Additionally, it is preferable that masking for the second photoresist contact pattern 42 opens up an area above word line D that is larger than the area that was opened up by first etch pattern 30, so as to compensate for a possible misalignment. The contact hole on word line D that is made by the first etching step will preferably have a surface area that is less than that of the contact hole on word line D that is made by the second etching step.

P+ doped polysilicon layer 38 is etched by a further etching step so as to result in second etch pattern 44. Second etch pattern 44 is a result of an etching step that etches polysilicon with a selectivity to oxide. This polysilicon etch will preferably have an isotropic component so as to remove polysilicon stringers that could be formed by misaligning at region f seen in FIG. 6 above word line D, either at the first masking step seen in FIG. 2, or at the second masking step seen in FIG. 5.

The third etching step results in a third etch pattern 46 into nitride spacer 24 of the gate of word line D so as to expose $WSi_x$ layer 22. Third etch pattern 46 is a result of an etching step that etches nitride with a reasonable selectivity to oxide, to polysilicon, and to $WSi_x$.

Figure 7:
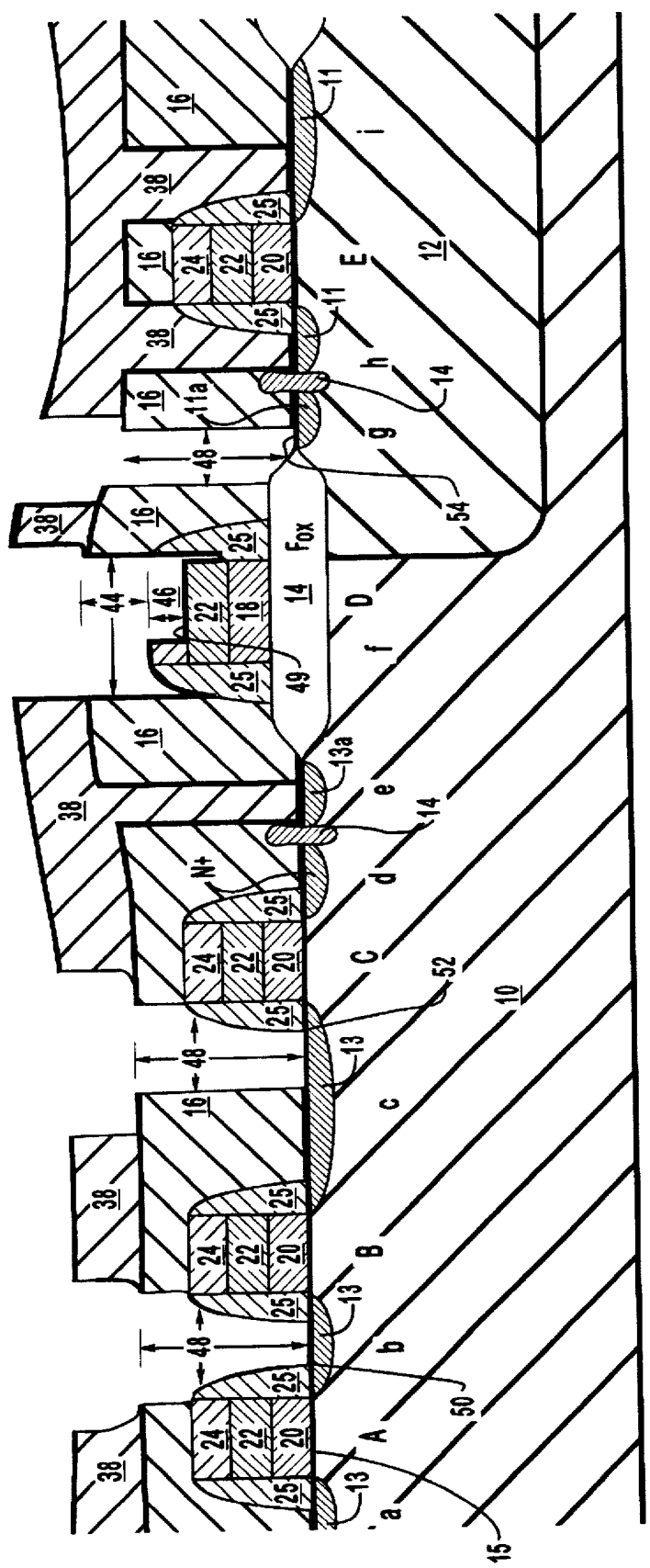
FIG. 7 is a cross-sectional elevation view of the structure seen in FIG. 6, with the addition of a fourth etching step resulting in contact holes to the doped silicon substrate for active areas b, c, and g, and where the contact hole over word line D seen at region f remains exposed.

To form the resultant structure seen in FIG. 7, another etching step is added which is a dry etch using a chemistry that etches oxide with selectivity to nitride, $WSi_x$, and to polysilicon. The result of this etching step is a fourth etch pattern 48, which exposes contact holes to active areas b, c, and g. FIG. 7 also shows that second photoresist layer 40 seen in FIG. 6 has been cleaned from the structure. As can be seen from FIG. 7, contacts to active areas b, c, and g have become self-aligned with respect to surrounding structures at the bottom of fourth etch pattern 48 due to etch selectivities and second photoresist contact patterns 42 seen in FIG. 6.

Figure 8:
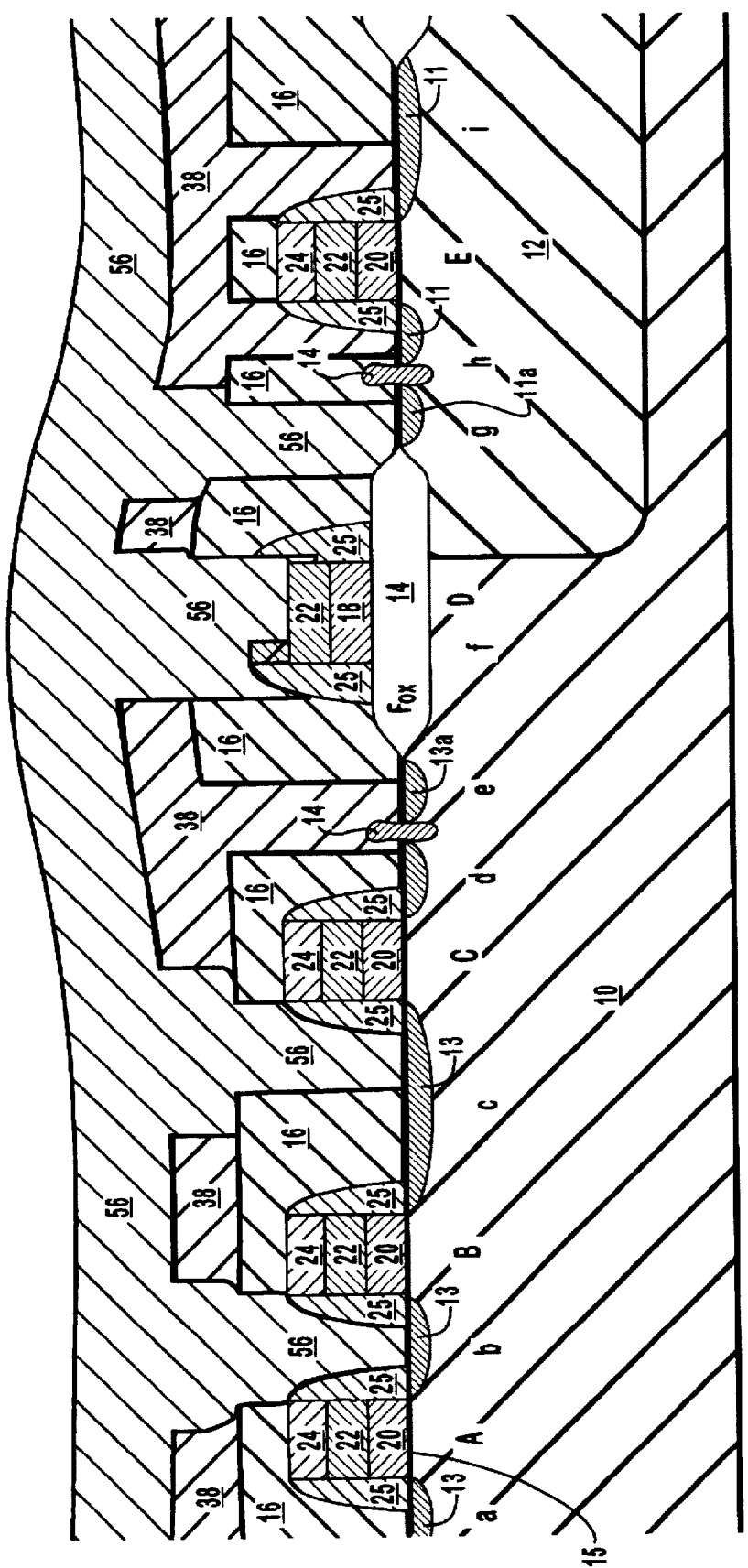
FIG. 8 is a cross-sectional elevation view of the structure seen in FIG. 7, with the addition of a layer of N+ doped polysilicon over the then-exposed structure so as to cover contacts formed in the regions of FIG. 8 seen at b, c, f, and g.

Following the etching step which created fourth etch pattern 48 showing FIG. 7, FIG. 8 shows the deposition of an N+ doped polysilicon layer 56 over the structure seen in FIG. 7 so as to make contact with active layers b, c, e, g, and i, as well as $WSi_x$ layer 22 of the gate of word line D.

The structure seen in FIG. 9 is the result of a CMP step, or alternatively, a dry etch back step, so as to isolate resultant plugs from either of N+ doped polysilicon layer 56 or P+ doped polysilicon layer 38. Either of the CMP step or the etch back step serve as an example and illustration of a height reduction step in which the two differently doped polysilicon conductive layers making contact with contact holes to the word line D and to the regions a, b, c, d, e, g, h and i are separated one from another.

The foregoing recited fabrication processing steps permit contact with source and drain areas as well as doped well areas at which contacts were made by the desired polarity of polysilicon plugs. Thus, N+ doped polysilicon plugs are used to contact NMOS source/drain areas as well as N+ doped well areas. Similarly, P+ doped polysilicon plugs are used to make contact with P+MOS source/drain areas and P+ doped well areas. Additionally, the foregoing fabrication processing steps can be used to establish contact with word lines having polysilicon gates situated over field oxide regions using either N+ doped polysilicon plugs or P+ doped polysilicon plugs depending on the polarity of the polysilicon gates. Where P+ doped polysilicon plugs are required for contacting the polysilicon gates over field oxide regions, the masking sequence step and the step for the deposition of N+ doped and P+ doped polysilicon layers can be reversed from that described above.

A suggested enhancement is the addition of a thin nitride film immediately underneath and in contact with BPSG layer 16 as seen in FIG. 1. The purpose of this thin nitride film at the bottom of planarizing BPSG layer 16 is to obtain long over-etching of the various contacts and to minimize the etching into field oxide regions 14 and the various active areas 11, 11a, 13, and 13a. Alternatively, or in combination, a thin nitride film could also be used on top of BPSG layer 16 so as to obtain an etch stop for the height reduction step which results in the structure seen in FIG. 9.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for preparing an integrated circuit structure, said integrated circuit structure including a doped semiconductor substrate having an oppositely doped well therein, a plurality of gate stacks over the substrate, three of said plurality of gate stacks being part of transistors A, B, and C upon said substrate, the A and B transistors having a doped source/drain region b therebetween in the substrate, the B and C transistors having a doped source/drain region c therebetween in the substrate, one of said plurality of gate stacks being part of a gate stack D situated upon a field oxide region in both said substrate and well, one of said plurality of gate stacks being part of a transistor E situated over said well and having source/drain regions h and i adjacent thereto, a doped source/drain region of the transistor C being separated from a doped active region e in the substrate against the field oxide region under the gate stack D by a field oxide region, a doped source/drain region of the transistor E being separated from a doped active region g in the well against the field oxide region under the gate stack D by a field oxide region, said regions e, h, and i being of opposite doping than regions b, c, and g, the method comprising:

applying a passivation layer of oxide on structures over said substrate, including said plurality of gate stacks, regions b, c, e, h, and i and including each of said field oxide regions;

applying a first layer of photoresist over the passivation layer of oxide;

aligning and exposing the first layer of photoresist;

developing the first layer of photoresist;

etching with a first dry etch chemistry through the passivation layer of oxide to create contact holes down to the regions e, h, and i, and down to the gate stack D;

depositing a first conductive layer over the passivation oxide layer, over contact holes of the regions e, h, i, and over the contact hole of the gate stack D;

applying a second layer of photoresist over the first conductive layer;

aligning and exposing the second layer of photoresist;

developing the second layer of photoresist;

etching with a second dry etch chemistry sequentially with a first, second, and third etchant, wherein:

said first etchant is selective to the passivation layer of oxide and to nitride, and etches through the first conductive layer;

said second etchant is selective to the passivation layer of oxide and to refractory metal silicides, and etches through a layer of nitride over gate stack D to expose a contact hole therein; and said third etchant is selective to nitride, the first conductive layer, refractory metal silicides, and to silicon, and etches through the passivation layer of oxide to create contact holes to the b, c, and g regions;

depositing a second conductive layer, opposite in doping to that of the first conductive layer, over the contact hole of the gate stack D and over the contact holes of the regions b, c, and g; and performing a height reduction, whereby the first conductive layer forms separated contacts from the regions h and i.

2. The method as defined in claim 1, wherein said height reduction is a chemical-mechanical polishing.

3. The method as defined in claim 1, wherein the height reduction is a dry etch back.

4. The method as defined in claim 1, wherein said height reduction isolates, one from another, the doped contacts to the contact holes of the first conductive layer to the regions b, c, e, g, h, i, and doped contact of the second conductive layer to the contact hole of the gate stack D.

5. The method as defined in claim 1, wherein said height reduction separates the first and second conductive layers to form individual contacts to the substrate, the well, and to the gate stack D, each said individual contact being separated one from another.

6. The method as defined in claim 1, further comprising depositing a first thin layer of nitride on structures over said substrate, including said plurality of gate stacks, regions b, c, e, h, and i, and including each of said field oxide regions prior to said depositing a passivation layer of oxide on structures over said substrate.

7. The method as defined in claim 6, further comprising depositing a second thin layer of nitride on top of the passivation layer of oxide after said applying a passivation layer of oxide on structures over said substrate, whereby said deposited layer of nitride over said passivation layer of oxide is a barrier layer for said height reduction.

8. The method as defined in claim 1, further comprising applying a layer of nitride on top of the passivation layer of oxide after depositing a passivation layer of oxide.

9. The method as defined in claim 1, wherein said etching with a second dry etch chemistry contains an isotropic component for lateral removal of portions of the first conductive layer in contact with the gate stack D.

10. The method as defined in claim 1, further comprising ion implanting active regions in the substrate prior to at least one of the deposition of the first and second conductive layers.

11. The method as defined in claim 1, wherein the semiconductor substrate is P− doped silicon, the well is N− doped silicon, each of said plurality of gate stacks comprises an N+ doped polysilicon gate electrode with a refractory metal silicide layer thereover, both the gate electrode and the refractory metal silicide layer of each said gate stack is covered under a layer of nitride, each of the A, B, and C transistors is an NMOS device, the transistor E is a PMOS device, each of regions e, h and i is P+ doped, each of regions b, c, and g is N+ doped, the first conductive layer is P+ doped polysilicon, the second conductive layer is N+ doped polysilicon, the first dry etch chemistry is selective to nitride and to silicon and etches down into the nitride layer of gate stack D, the first conductive layer is deposited over and in contact with the nitride layer of gate stack D, the second etchant of the second dry etch chemistry etches through the first conductive layer and the layer of nitride of gate stack D to expose a contact hole on the layer of refractory metal silicide of gate stack D, the third etchant of the second dry etch chemistry is selective to nitride, refractory metal silicide, and to the N+ doped polysilicon gate electrode of gate stack D, and the second conductive layer is deposited over and in contact with the refractory metal silicide layer of gate stack D.

12. The method as defined in claim 11, wherein the refractory metal silicide of each of the plurality of gate stacks is $WSi_x$.

13. A method for preparing an integrated circuit structure, said integrated circuit structure including a P− doped silicon substrate having a N− doped silicon well therein, a plurality of gate stacks over the silicon substrate, each said gate stack having a N+ doped gate electrode with a tungsten silicide layer thereover, both the gate electrode and the tungsten silicide layer of the each gate stack being covered under a layer of nitride, three of said plurality of gate stacks being part of NMOS transistors A, B, and C upon said P− doped silicon substrate, the A and B transistors having an N+ doped source/drain region b therebetween in the substrate, the B and C transistors having an N+ doped source/drain region c therebetween in the substrate, one of said plurality of gate stacks being a gate stack D situated upon a field oxide region with both said silicon substrate and well, one of said plurality of gate stacks being an PMOS transistor E situated over said silicon well and having P+ doped source/drain regions h and i adjacent thereto, an N+ doped source/drain region of the NMOS transistor C being separated from a P+ doped active region e in the silicon substrate in contact with the field oxide region under the gate stack D by a field oxide region, a P+ doped source/drain region of the PMOS transistor E being separated from a N+ doped active region g in the silicon well in contact with the field oxide region under the gate stack D by a field oxide region, the method comprising:

applying a passivation layer of oxide on structures over said substrate, including said plurality of gate stacks, regions b, c, e, h, and i and including each of said field oxide regions;

applying a first layer of photoresist over the passivation layer of oxide;

aligning and exposing the first layer of photoresist;

developing the first layer of photoresist;

etching with a first dry etch chemistry selective to nitride and to silicon through the passivation layer of oxide to create contact holes down to the P+ doped regions e, h, and i, and down to the nitride layer of gate stack D;

depositing a first conductive layer of P+ doped polysilicon over both the passivation oxide layer, the contact holes of the regions e, h, i, and the contact hole of the nitride layer of gate stack D;

applying a second layer of photoresist over the first conductive layer;

aligning and exposing the second layer of photoresist;

developing the second layer of photoresist;

etching with a second dry etch chemistry sequentially with a first, second, and third etchant, wherein:
    said first etchant is selective to the passivation layer of oxide and to nitride, and etches through the first conductive layer;
    said second etchant is selective to the passivation layer of oxide and tungsten silicide, and etches through the layer of nitride of gate stack D to expose a contact hole on the layer of tungsten silicide of gate stack D; and
    said third etchant is selective to nitride, tungsten silicide, and to the N+ doped polysilicon of gate stack D, and etches through the passivation layer of oxide to create the contact holes to the N+ doped b, c, and g regions;

depositing a second conductive layer of N+ doped polysilicon over the contact hole of the tungsten silicide layer of gate stack D and over the contact holes of the N+ doped regions b, c, and g; and performing a height reduction, whereby the first conductive layer forms separated contacts to the contact holes of the P+ doped regions h and i.

14. The method as defined in claim 13, wherein said height reduction is a chemical-mechanical polishing.

15. The method as defined in claim 13, wherein the height reduction is a dry etch back.

16. The method as defined in claim 13, wherein said height reduction isolates the doped polysilicon contacts to contact holes of the regions b, c, e, g, h, i, and to the tungsten silicide layer of the gate stack D, one from another.

17. The method as defined in claim 13, wherein said height reduction separates the first and second conductive layers to form individual contacts to the substrate, the well, and to tungsten silicide layer of the gate stack D, each said individual contact being separated one from another.

18. The method as defined in claim 13, further comprising depositing a first thin layer of nitride on structures over said substrate, including said plurality of gate stacks, regions b, c, e, h, and i, and including each of said field oxide regions prior to said depositing a passivation layer of oxide on structures over said substrate.

19. The method as defined in claim 18, further comprising depositing a second thin layer of nitride on top of the passivation layer of oxide after said applying a passivation layer of oxide on structures over said substrate, whereby said deposited layer of nitride over said passivation layer of oxide is a barrier layer for said height reduction.

20. The method as defined in claim 13, further comprising applying a layer of nitride on top of the passivation layer of oxide after depositing a passivation layer of oxide.

21. The method as defined in claim 13, wherein said etching with a second dry etch chemistry contains an isotropic component for lateral removal of portions of the first conductive layer in contact with the gate stack D.

22. The method as defined in claim 13, further comprising ion implanting active regions in the silicon substrate prior to at least one of said deposition of the first and second conductive layers.

23. A method for preparing an integrated circuit structure, said integrated circuit structure including a doped semiconductor substrate having an oppositely doped well therein, a plurality of gate stacks over the substrate, three of said plurality of gate stacks being part of transistors A, B, and C upon said substrate, the A and B transistors having a doped source/drain region b therebetween in the substrate, the B and C transistors having a doped source/drain region c therebetween in the substrate, one of said plurality of gate stacks being part of a gate stack D situated upon a field oxide region in both said substrate and well, one of said plurality of gate stacks being part of a transistor E situated over said well and having source/drain regions h and i adjacent thereto, a doped source/drain region of the transistor C being separated from a doped active region e in the substrate against the field oxide region under the gate stack D by a field oxide region, a doped source/drain region of the transistor E being separated from a doped active region g in the well against the field oxide region under the gate stack D by a field oxide region, said regions e, h, and i being of opposite doping than regions b, c, and g, the method comprising:

applying a passivation layer of oxide on structures over said substrate, including said plurality of gate stacks, regions b, c, e, h, and i, and further including each of said field oxide regions;

applying an initial layer of photoresist;

aligning and exposing the initial layer of photoresist;

developing the initial layer of photoresist;

etching with an initial dry etch chemistry sequentially with a first etchant, wherein said first etchant etches through the passivation layer of oxide over the gate stack D and over regions e, h, and i to create contact holes to the regions e, h, and i;

depositing an initial conductive layer over and in contact with the contact hole of the gate stack D and over the contact holes of regions e, h, and i;

applying a secondary layer of photoresist;

aligning and exposing the secondary layer of photoresist;

developing the secondary layer of photoresist;

etching with a secondary dry etch chemistry sequentially with a second etchant, and a third etchant, wherein:

said second etchant etches through the initial conductive layer over gate stack D and over regions b, c, and g; and said third etchant etches through the passivation layer of oxide to create contact holes at the regions b, c, and g, and etches through gate stack D to expose a contact hole on gate stack D;

depositing a secondary conductive layer, opposite in doping to that of the initial conductive layer, over the initial conductive layer and over the contact holes at the regions b, c, and g, and over the contact hole on gate stack D; and performing a height reduction, whereby the first conductive layer forms separated contacts from the regions h and i.

24. The method as defined in claim 23, wherein said height reduction is a chemical-mechanical polishing.

25. The method as defined in claim 23, wherein the height reduction is a dry etch back.

26. The method as defined in claim 23, wherein said height reduction isolates the doped contacts to regions b, c, e, g, h, i, and to the gate stack D one from another.

27. The method as defined in claim 23, wherein said height reduction separates the first and second conductive layers to form individual contacts to the substrate, the well, and to the gate stack D, each said individual contact being separated one from another.

28. The method as defined in claim 23, further comprising depositing a first thin layer of nitride on structures over said substrate, including said plurality of gate stacks, regions b, c, e, h, and i, and including each of said field oxide regions prior to said depositing a passivation layer of oxide on structures over said substrate.

29. The method as defined in claim 28, further comprising depositing a second thin layer of nitride on top of the passivation layer of oxide after said applying a passivation layer of oxide on structures over said substrate, whereby said deposited layer of nitride over said passivation layer of oxide is a barrier layer for said height reduction.

30. The method as defined in claim 23, further comprising applying a layer of nitride on top of the passivation layer of oxide after depositing a passivation layer of oxide.

31. The method as defined in claim 23, wherein said etching with the secondary dry etch chemistry contains an isotropic component for lateral removal of portions of the initial conductive layer in contact with the gate stack D.

32. The method as defined in claim 23, further comprising ion implanting active regions in the substrate prior to at least one of the deposition of the initial and secondary conductive layers.

33. The method as defined in claim 23, wherein the semiconductor substrate is P− doped silicon, the well is N− doped silicon, each of said plurality of gate stacks comprises an N+ doped polysilicon gate electrode with a refractory metal silicide layer thereover, both the gate electrode and the refractory metal silicide layer of each said gate stack is covered under a layer of nitride, each of the A, B, and C transistors is an NMOS device, the transistor E is a PMOS device, each of regions e, h and i is P+ doped, each of regions b, c, and g is N+ doped, the initial conductive layer is P+ doped polysilicon, the secondary conductive layer is N+ doped polysilicon, the second etchant of the initial dry etch chemistry etches through the layer of nitride of gate stack D to expose a contact hole on the layer of refractory metal silicide of gate stack D, and the initial conductive layer is deposited over and in contact with the refractory metal silicide layer of gate stack D.

34. The method as defined in claim 33, wherein the refractory metal silicide of each of the plurality of gate stacks is tungsten silicide.

35. The method as defined in claim 23, wherein both the etch with the initial dry etch chemistry and the etch with the secondary dry etch chemistry make a contact hole on the gate stack D.

36. The method as defined in claim 35, wherein the contact hole on the gate stack D made by the etch with the initial dry etch chemistry has a surface area on gate stack D that is less than the surface area of the contact hole on the gate stack D made by the etch with the secondary dry etch chemistry.

37. The method as defined in claim 23, wherein the etch with the secondary dry etch chemistry is an isotropic etch, whereby the initial and secondary conductive layers are separated one from the other after the height reduction.

* * * * *